United States Patent [19]

Beha et al.

[11] Patent Number: 4,670,710

[45] Date of Patent: Jun. 2, 1987

[54] NONCONTACT FULL-LINE DYNAMIC AC TESTER FOR INTEGRATED CIRCUITS

[75] Inventors: Johannes G. Beha, Wadenswil, Switzerland; Russell W. Dreyfus, Mt. Misco; Gary W. Rubloff, Katonah, both of N.Y.

[73] Assignee: International Business Machines Corporation, Armonk, N.Y.

[21] Appl. No.: 717,407

[22] Filed: Mar. 29, 1985

[51] Int. Cl.$^4$ .................... G01R 15/12; G01R 13/02; G01N 23/22

[52] U.S. Cl. ............................ 324/73 R; 324/158 R; 324/158 D; 250/310; 250/311

[58] Field of Search ............ 324/158 R, 158 D, 73 R; 250/491.1, 491.1, 492.1, 310, 311

[56] References Cited

U.S. PATENT DOCUMENTS

| | | | |
|---|---|---|---|
| 2,659,264 | 11/1953 | Tuttle et al. | 88/14 |
| 2,663,215 | 12/1953 | Tuttle et al. | 88/14 |
| 2,951,961 | 9/1960 | Cooper, Jr. | 313/76 |
| 3,124,790 | 3/1964 | Kuehler | 340/174.1 |
| 4,220,854 | 9/1980 | Feuerbaum | 324/158 R |
| 4,301,409 | 11/1981 | Miller et al. | 324/158 D |

Primary Examiner—Reinhard J. Eisenzopf
Assistant Examiner—Vinh P. Nguyen
Attorney, Agent, or Firm—Carl C. Kling

[57] ABSTRACT

Simultaneous noncontact testing of voltages across a full line of test sites on an integrated circuit chip-to-test is achieved with high time resolution using photoelectron emission induced by a pulsed laser focussed to a line on the chip-to-test, together with high speed electrostatic deflection perpendicular to the line focus. Photoelectrons produced by the line focus of pulsed laser light are imaged to a line on an array detector, the measured photoelectron intensities at array points along this line representing voltages at corresponding points along the line illuminated by the laser focus. High speed electrostatic deflection applied during the laser pulse, perpendicular to the direction of the line focus, disperses the line image (column) on the array detector across a sequence of sites at right angles (rows), thereby revealing the time-dependence of voltages in the column of test sites with high time resolution (in the picosecond range).

3 Claims, 2 Drawing Figures

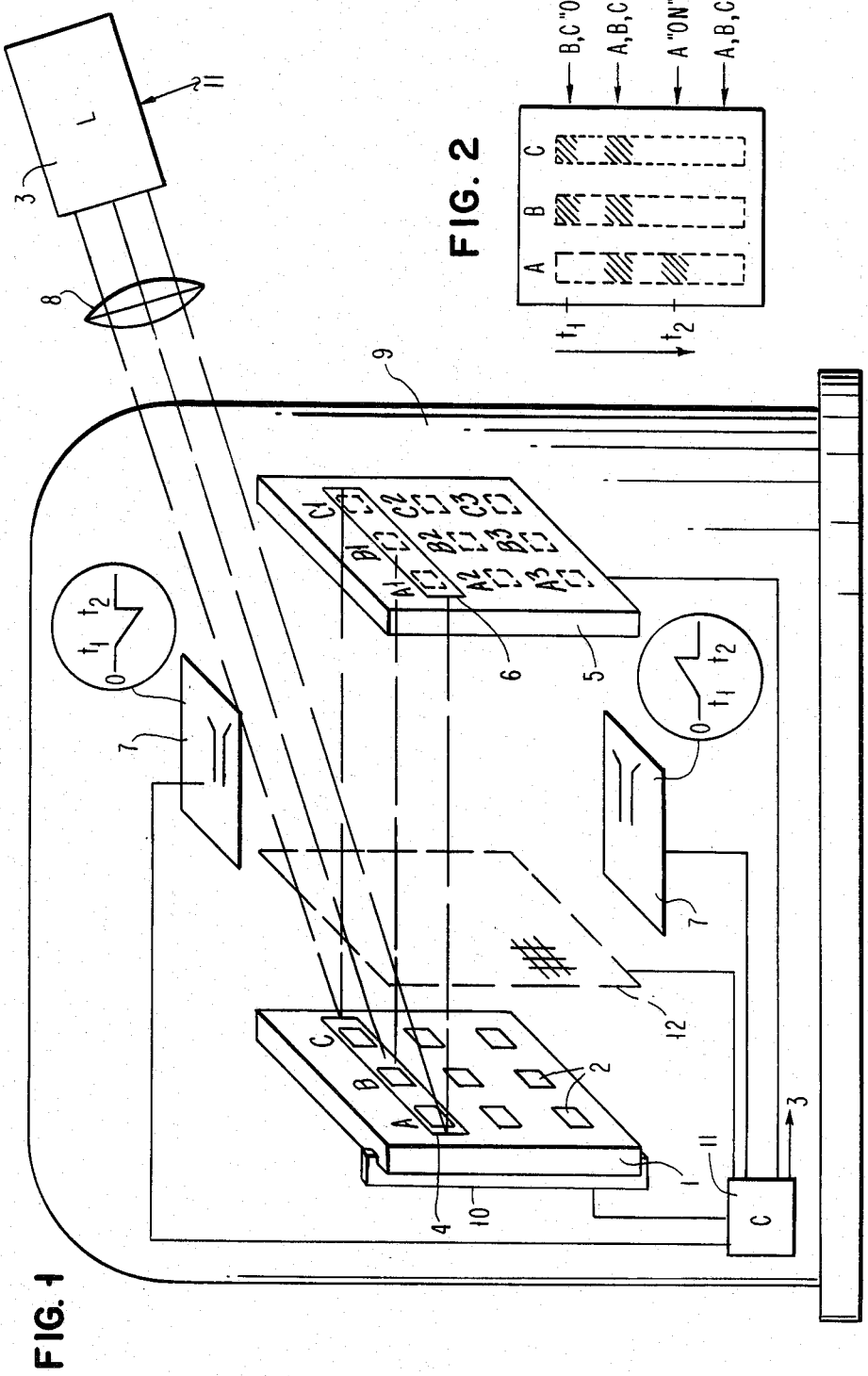

NONCONTACT FULL-LINE DYNAMIC AC TESTER FOR INTEGRATED CIRCUITS

BACKGROUND OF THE INVENTION

1. Field of the Invention

This invention relates to noncontact testing of integrated circuits, and more particularly relates to full-line dynamic AC testing of integrated circuits at very high speed and resolution using laser induced photoemission modulated by instantaneous circuit operation voltages.

2. Description of the Prior Art

A copending U.S. patent specification by Beha, Dreyfus and Rubloff discloses techniques for using photoemission induced by a pulsed ultraviolet laser to measure the voltage at specific points on a VLSI or VHSIC chip in real time with every high time resolution (about 10 picoseconds or less). The measured photocurrent reflects directly the voltage of the point on the chip being tested because this voltage affects the acceleration or retardation field sensed by the emitted electron. Specific laser systems capable of pulse widths in the picosecond range (or less) were proposed, and embodiments given, so that the actual AC switching waveform at a single point could be measured with picosecond time resolution, i.e., fast enough for advanced high speed circuits. Although such laser systems, already available in state-of-the-art laboratories, can be used for sequential measurements of this kind over the entire chip by scanning the laser beam, the power of such laser systems (operating in the picosecond range) today is not sufficient to accomplish simultaneous measurement of many points on the chip—i.e., for full-chip testing of a two-dimensional array of points as desired for manufacturing and other applications.

The following publications are representative of the prior art: U.S. Pat. No. 3,124,790, Kuehler, APPARATUS FOR READING MAGNETIC OR ELECTROSTATIC BITS, IBM, Mar. 10, 1964. Kuehler shows an electron beam scan of a pattern of recorded data, with varying deflection depending upon bit value.

U.S. Pat. No. 4,220,854, Feuerbaum, METHOD FOR THE CONTACTLESS MEASUREMENT OF THE POTENTIAL WAVEFORM IN AN ELECTRONIC COMPONENT AND APPARATUS FOR IMPLEMENTING THE METHOD, Sept. 2, 1980. Feuerbaum shows a phase comparison technique for using an e-beam scanner to measure the potential waveform in an electronic component.

U.S. Pat. No. 4,301,409, Miller et al, SOLAR CELL ANOMALY DETECTION METHOD AND APPARATUS, Nov. 17, 1981. Miller et al shows a technique for using a light scanner (dual laser or broad-spectrum) to test a solar cell for anomalies by biasing the entire cell with light of deep penetration wavelength while focussing a small light spot on the surface.

The prior art does not teach nor suggest the invention, which is column scanning across an array detector which in turn is visually responsive to row scanning of an emission pattern produced by an integrated circuit chip-to-test in response to dynamics of test operation and a laser beam focused to a line image, to provide good space-time resolution by crosspoint selection of threshold voltages at the array detector so as to provide an array output at each differential instant of time during the chip test-time.

SUMMARY OF THE INVENTION

A pulsed laser beam is focussed to a line across a column of test points on an integrated circuit chip-to-test. Photoelectrons produced by this laser light pulse are imaged to a line on an array detector, such that the measured photoelectron intensities at array points along this line represent voltages at corresponding points along the line illuminated by the laser focus. High speed electrostatic deflection applied during the laser pulse perpendicular to the direction of the column line focus disperses the column image on the array detector across a sequence of rows, which thereby reveal the time-dependence of voltages in the column of test points with high time resolution (in the picosecond range).

The object of the invention is to test a full chip integrated circuit rapidly without subjecting the chip to complicated or destructive probing.

Another object of the invention is to obtain nondestructive dynamic simultaneous testing of a one-dimensional array of test points with time resolution sufficient to monitor AC switching waveforms (picosecond range).

A feature of the invention is focussing of a pulsed ultraviolet laser beam to a line focus on the chip-to-test to effect the simultaneous emission of photoelectrons from a column of test points along the line.

Another feature of the invention is the use of retardation and acceleration grids, or other electron optics, to modulate photoelectron signal currents according to their initial energy distribution, which reflects the voltage of the emitting test points.

Another feature of the invention is the reimaging of the photoelectron line image, so modulated, onto a column line on an array detector for photoelectron signals.

A further feature of the invention is the use of fast electron deflection, as in a streak camera, to disperse the photoelectrons spatially across the array detector as a funtion of time in a direction perpendicular to the column line focus of the laser beam, thereby revealing the time-dependence of chip test point voltages along the line with high time resolution in the picosecond range, sufficient for measurement of AC switching waveforms.

An advantage of the invention is that testing speed is increased through the simultaneous measurement of many points on the chip-to-test, i.e., those along the laser line focus.

Another advantage of the invention is that the increased testing speed is attained with very high time resolution sufficient to measure AC switching waveforms of state-of-the-art high speed integrated circuits.

An advantage of the invention is its utility in automatic testing of complex integrated circuits by scanning quickly, and storing results for subsequent computer review.

The foregoing and other objects, features and advantages of the invention will be apparent from the more particular description of the preferred embodiments of the invention, as illustrated in the accompanying drawings.

BRIEF DESCRIPTION OF THE DRAWINGS

FIG. 1 is a schematic diagram of the invention.

FIG. 2 is an operational diagram of typical test results.

DESCRIPTION OF A PREFERRED EMBODIMENT OF THE INVENTION

This U.S. patent specification provides for simultaneous real-time dynamic measurement of voltage at each of many points on an integrated circuit, in a one-dimensional array. The measurement has picosecond time resolution as needed for observing AC switching waveforms, and yet employs currently available laser systems such as the standard excimer laser of the preferred embodiment.

FIG. 1 is a schematic drawing to illustrate the principles of operation of the invention. It is desired to measure the voltages at numerous test points on a chip-to-test as a function of time with high measurement speed and at the same time high time resolution sufficient to observe AC switching waveforms of high speed integrated circuits. The chip-to-test 1 is inserted into a vacuum chamber, mounted onto a holder such that its input/output terminals are connected to a drive circuitry sufficient to power and exercise the chip at its design speed. Test on chip-to-test 1 are shown diagrammatically as areas 2.

During each measurement cycle the time-dependence of voltages along a single line of test points on the chip is determined as follows. A pulsed laser beam 3 is focussed onto a line 4 on the chip, such as that shown in FIG. 1 at the top of the chip, consisting of several test points 2 (such as those denoted A, B and C in the FIG. 1). While the test sites 2 need not be in any fixed pattern, for purposes of discussion points A, B and C will be considered a column and the perpendicular will be considered a row.

This laser light must be ultraviolet of sufficiently short wavelength (i.e., sufficiently high photon energy) to cause photoelectron emission into vacuum; typically this threshold is about 4.0 eV energy or 3000 angstroms wavelength. In addition, the laser intensity must be sufficient for generating reasonable signals for multiple test points along the line simultaneously. The time duration of the laser pulse is intended to be longer than the period t1-t2; for instance, an excimer system having a pulse length of 20 nanoseconds for a t1-t2 period of 10 nanoseconds.

Using a system of electron optical grids 12 and possibly additional electron lenses (not shown), the photoelectron signals emitted from the line image 4 on the chip are modulated and refocussed onto a two-dimensional array electron detector 5 along a line 6 such that the measured photoelectron intensity at each point is representative of the voltage present at the corresponding test point along the column line 4 on the chip during the laser pulse. The signal modulation process employed is similar to that described in Beha, Dreyfus, and Rubloff work. Electron optical grids 12 serve as energy analysis grid means to control photoelectron emissions according to desired acceleration/threshold parameters.

At the present state-of-the-art of lasers, these requirements can only be met with reasonable testing speed with nanosecond laser pulses, such as from commercially available excimer lasers (such as KrF, etc.). Nanosecond time resolution is often sufficient to distinguish voltages during different timing (clock) states of chip voltages, but not to resolve the shape of AC switching waveforms for voltages on high speed integrated circuits. To achieve the latter, enhanced time resolution in the picosecond range is obtained by exploiting high speed electrostatic deflection like that used in a streak camera.

A set of electrostatic deflection plates 7 is employed, as electron image scanning means, to scan the photoelectron line image 6 across the array detector 5 in a direction perpendicular to the line image itself, i.e., along a row direction. Very fast voltage ramps, about 100 picoseconds in time and oppositely polarized, are applied to the plates 7 so that successive line images on the array detector can be resolved according to spatial separations on the array detector which correspond to a few picoseconds in time resolution. With the deflection pulse coincident with the beginning of the laser pulse, high time resolution of chip voltages during the laser pulse is achieved as desired. The laser pulse 3 is focussed by focussing means 8 which may be a cylindrical lens, producing a line scan, the laser and scan focussing means forming a pulsed laser scan means forming a line image on chip-to-test 1. For purposes of illustration, a single ramp t1-t2 is shown. An extension of this is to use a portion of an oscillating electric field so as to obtain higher rates of change.

Thus in the schematic of FIG. 1, the voltages for test points A, B and C on the chip are reflected as a sequence of photoelectron intensities on the array detector 5, such that the intensities at A1, B1 and C1 on the detector reflect voltages at time instant 1; those at A2, B2 and C2 reflect voltages of chip points A, B and C at time instant 2; and so on.

High speed parallel detection electronics are used to acquire and process the relevant signals from the two-dimensional array detector 5. In each measurement the chip voltages for a set of test points along a line on the chip are determined as a function of time in the picosecond time resolution range. To measure the time-dependence of voltages for test points along another column line on the chip, the laser is focussed to another column line position on the chip and the above measurements carried out again. The entire operation is preferrably carried out in vacuum chamber 9, although laser 3 and its related optics may be external. Mounting means 10 may be any suitable holder, either simple or a conveyor for repetitive presentation of chips-to-test, with connections for mechanical support and electronic input and output connections for circuit exercise.

Computer 11 controls and analyzes the entire operation, providing controlled exercise for the chip-to-test 1, control of the pulsed laser scan means 3, 8, control of deflection ramps applied to deflection means 7, and control of accelerating or threshold bias applied to energy analysis grid 12 to control test decisions, and analysis of measured voltages with respect to nominal voltages for the exercise applied.

FIG. 2 shows representative results over time t1-t2, in context of detector 5 in FIG. 1, as a vidicon image. Deflection is perpendicular to the laser scan, as shown by the arrow, giving the result tabulated for the appropriate exercise.

Thus, while the invention has been described with reference to a preferred embodiment, it will be understood by those skilled in the art that various changes in form and details may be made without departing from the scope of the invention.

For example, the test points 2 on the chip-to-test 1 may consist of specific interconnection lines or contacts already present for operation of the integrated circuit. Alternatively special test pads may be fabricated on the chip for the above testing purposes. The chip-to-test may in fact be a single integrated circuit chip or all or part of a full semiconductor wafer out of which numerous chips are fabricated. It may also be simpler packaging vehicle made for electronics system interconnections, or a vehicle with other electronics purposes in which it is desired to test voltages at various points.

Having thus described our invention, what we claim as new, and desire to secure by Letters Patent is:

1. A testing system for noncontact full-time dynamic testing of integrated circuits on a semiconductor chip-to-test (1), the chip-to-test (1) having a multiplicity of test sites (2), comprising:
    (a) a vacuum chamber (9);
    (b) mounting means (10) for mounting the chip-to-test (1) mechanically and electrically for test operation, with at least one face accessible to light so as to present within said vacuum chamber (9) a path for photoemitted electrons from said accessible face into said vacuum chamber (9);
    (c) pulsed laser scan means (3), (8) for producing a line image (4) on the chip-to-test (1), thus activating all test sites (2) within the line image (4) for photoemission as a function of instantaneous voltage;
    (d) detector means (5) mounted facing the accessible face of the chip-to-test (1) so as to detect electrons from said accessible face across at least a portion of said vacuum chamber (9);
    (e) electron image scanning means within said vacuum chamber (9) for directing photoelectrons emitted from laser line image (4) test sites (2) on the chip-to-test (1) onto a corresponding line (6) on two-dimensional array detector (5);
    (f) means (11) for controlling circuit operation of the chip-to-test, connected to said other means (b-e) for control and for determining test results related to voltage modulated photoelectron currents at emitting test sites.

2. A testing system according to claim 1, comprising; said electron image scanning means comprises electron deflection means includes electrostatic deflection plates (7) arranged to scan the image on the detector array (5) rapidly in a direction perpendicular to the direction of the line image (4) provided by said line scanning means (3, 8), and said control and analysis means (11) comprises means to produce very fast voltage ramps of opposite polarity on deflection plates (7), means to acquire and process at high speed two-dimensional intensity image information from the photoelectrons arriving at said array detector means (5), and means for timing the pulsed laser means, electron deflection means, and chip operation timing accurately so as to relate said test results properly to voltages on the chip during its dynamic operation.

3. A testing system according to claim 1, comprising: grid means (12) to control photoelectron emissions according to desired acceleration/threshold parameters.

* * * * *